(12) United States Patent
Ding et al.

(10) Patent No.: US 7,394,702 B2
(45) Date of Patent: Jul. 1, 2008

(54) METHODS FOR ERASING AND PROGRAMMING MEMORY DEVICES

(75) Inventors: Meng Ding, Sunnyvale, CA (US); Zhizheng Liu, San Jose, CA (US); Wei Zheng, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/399,130

(22) Filed: Apr. 5, 2006

(65) Prior Publication Data

US 2007/0247923 A1    Oct. 25, 2007

(51) Int. Cl.
   *G11C 11/34* (2006.01)
(52) U.S. Cl. .............. 365/185.29; 365/185.03; 365/185.33; 365/185.24; 365/218
(58) Field of Classification Search ............ 365/185.29, 365/185.03, 185.33, 185.24, 218
   See application file for complete search history.

(56) References Cited

U.S. PATENT DOCUMENTS

| | | | |
|---|---|---|---|
| 6,242,306 B1 * | 6/2001 | Pham et al. ............... 438/262 |
| 6,261,904 B1 * | 7/2001 | Pham et al. ............... 438/257 |
| 6,355,514 B1 * | 3/2002 | Pham ....................... 438/211 |
| 6,480,414 B1 * | 11/2002 | Lin et al. ............... 365/185.03 |
| 6,639,271 B1 | 10/2003 | Zheng et al. |
| 6,735,123 B1 * | 5/2004 | Tripsas et al. .......... 365/185.26 |
| 6,768,160 B1 * | 7/2004 | Li et al. ...................... 257/315 |
| 6,861,307 B2 * | 3/2005 | Zheng et al. ................ 438/216 |
| 6,906,959 B2 * | 6/2005 | Randolph et al. ....... 365/185.29 |
| 6,914,820 B1 * | 7/2005 | Wong .................... 365/185.18 |
| 6,956,254 B2 * | 10/2005 | Yang et al. ................... 257/235 |
| 6,958,510 B2 * | 10/2005 | Pascucci .................... 257/311 |
| 2005/0104117 A1 | 5/2005 | Mikolajick et al. |
| 2005/0105341 A1 | 5/2005 | Forbes |
| 2005/0116281 A1 | 6/2005 | Yang et al. |

FOREIGN PATENT DOCUMENTS

EP    1205978 A2    5/2002

OTHER PUBLICATIONS

PCT Search Report for PCT/US07/08683, Dec. 7, 2007, Spansion LLC.
PCT Written Opinion for PCT/US07/08683, Dec. 7, 2007, Spansion LLC.

* cited by examiner

*Primary Examiner*—Viet Q Nguyen
(74) *Attorney, Agent, or Firm*—Ingrassia Fisher & Lorenz, P.C.

(57) ABSTRACT

A dual-bit memory device includes a first charge storage region spaced apart from a second charge storage region by an isolation region. Techniques for erasing a memory can be provided in which electrons can be injected into the charge storage regions to erase the charge storage regions. Other techniques for programming a memory can be provided in which holes can be injected into at least one of the charge storage regions to program the charge storage regions.

19 Claims, 5 Drawing Sheets

METHODS FOR ERASING AND PROGRAMMING MEMORY DEVICES

FIELD OF THE INVENTION

The present invention generally relates to memory devices, and more particularly relates to methods for erasing and programming a dual-bit memory device.

BACKGROUND OF THE INVENTION

Flash memory is a type of electronic memory media that can hold its data in the absence of operating power. Flash memory can be programmed, erased, and reprogrammed during its useful life (which may be up to one million write cycles for typical flash memory devices). Flash memory is becoming increasingly popular as a reliable, compact, and inexpensive nonvolatile memory in a number of consumer, commercial, and other applications. As electronic devices get smaller and smaller, it becomes desirable to increase the amount of data that can be stored per unit area on an integrated circuit memory cell, such as a flash memory unit.

One conventional flash memory technology is based upon a memory cell that utilizes a charge trapping dielectric cell that is capable of storing two bits of data. Non-volatile memory designers have recently designed memory circuits that utilize two charge storage regions to store charge within a single silicon nitride layer. This type of non-volatile memory device is known as a dual-bit Flash electrically erasable and programmable read-only memory (EEPROM), which is available under the trademark MIRRORBIT™ from Advanced Micro Devices, Inc., Sunnyvale, Calif. In such an arrangement, one bit can be stored using a first charge storing region on one side of the silicon nitride layer, while a second bit can be stored using a second charge storing region on the other side of the same silicon nitride layer. For example, a left bit and right bit can be stored in physically different areas of the silicon nitride layer, near left and right regions of each memory cell, respectively. In comparison to a conventional EEPROM cell, a dual-bit memory cell can store twice as much information in a memory array of equal size.

FIG. 1 is a cross-sectional view of a conventional dual-bit memory cell 50. The memory cell 50 has a dual-bit (bit1, bit2) architecture that allows twice as much storage capacity as a conventional EEPROM memory device.

The conventional memory cell 50 includes a substrate 54, a first insulator layer 62 disposed over the substrate 54, a nitride charge storage layer 64 disposed over the first insulator layer 62, a second insulator layer 66 disposed over the charge storage layer 64, and a polysilicon control gate 68 disposed over the second insulator layer 66. To produce an operable memory device, a first metal silicide contact (not shown) can be disposed on substrate 54, and the control gate 66 can be capped with a second metal silicide contact (not shown).

In one implementation, the substrate 54 is a P-type semiconductor substrate 54 having a first buried junction region 60 and a second buried junction region 61 formed within substrate 54 in self-alignment with the memory cell 50. First buried junction region 60 and second buried junction region 61 are each formed from an N+ semiconductor material. The charge storage layer 64 is capable of holding a charge. The first insulator layer 62, the charge storage layer 64, and the second insulator layer 66 can be implemented using an oxide-nitride-oxide (ONO) configuration in which a nitride charge storage layer 64 is sandwiched between two silicon dioxide insulator layers 62, 66. Alternatively, charge storage layer 64 may utilize buried polysilicon islands as a charge trapping layer.

Memory cell 50 can store two data bits: a left bit represented by the circle (bit 1); and a right bit represented by the circle (bit 2). In practice, memory cell 50 is generally symmetrical, thus first buried junction region 60 and second buried junction region 61 are interchangeable. In this regard, first buried junction region 60 may serve as the source region with respect to the right bit (bit 2), while second buried junction region 61 may serve as the drain region with respect to the right bit (bit 2). Conversely, second buried junction region 61 may serve as the source region with respect to the left bit (bit 1), while first buried junction region 60 may serve as the drain region with respect to the left bit (bit 1). A threshold voltage exists between the control gate 66 and the substrate 54 to prevent leakage during functioning of the device.

While a single dual-bit memory cell 50 is illustrated in FIG. 1, it will be appreciated that any suitable number of the dual-bit memory cells 50 could be used to form a memory array, as described below with reference to FIG. 2.

FIG. 2 is a simplified diagram of a plurality of dual-bit memory cells arranged in accordance with a conventional array architecture 200 (a practical array architecture can include thousands of dual-bit memory cells 50). Array architecture 200 includes a number of buried bit lines formed in a semiconductor substrate as mentioned above. FIG. 2 depicts three buried bit lines (reference numbers 202, 204, and 206), each being capable of functioning as a drain or a source for memory cells in array architecture 200. Array architecture 200 also includes a number of word lines that are utilized to control the gate voltage of the memory cells. FIG. 2 depicts four word lines (reference numbers 208, 210, 212, and 214) that generally form a crisscross pattern with the bit lines. Although not shown in FIG. 2, charge storage layer, such as an ONO stack, resides between the bit lines and the word lines. The dashed lines in FIG. 2 represent two of the dual-bit memory cells in array architecture 200: a first cell 216 and a second cell 218. Notably, bit line 204 is shared by first cell 216 and second cell 218. Array architecture 200 is known as a virtual ground architecture because ground potential can be applied to any selected bit line and there need not be any bit lines with a fixed ground potential.

Control logic and circuitry (not shown) for array architecture 200 governs the selection of memory cells, the application of voltage to the word lines 208, 210, 212, 214, and the application of voltage to the bit lines 202, 204, 206 during conventional flash memory operations, such as: programming; reading; erasing; and soft programming. Voltage is delivered to the bit lines 202, 204, 206 using bit line contacts (not shown). FIG. 2 depicts three conductive metal lines (reference numbers 220, 222, and 224) and three bit line contacts (reference numbers 226, 228, and 230). For a given bit line, a bit line contact is used once every 16 word lines because the resistance of the bit lines is very high.

When charging up the charge storage layer 64, one way to reduce or minimize power consumption is by using Fowler-Nordheim (FN) tunneling mechanism to inject electrons into the charge storage layer 64 and thereby erase the memory cell 50.

FIG. 3 is a cross-sectional view of the conventional dual-bit memory cell during a Fowler-Nordheim (FN) erase operation in which FN tunneling can be used to inject electrons into the nitride charge storage layer 64. The basic structure of the memory cell 50 is described above with respect to FIG. 1, and for sake of brevity will not be described again. The buried junction regions 60, 61 can either be floating or grounded.

The highly positive gate 68 bias voltage (e.g., 18 volts to 20 volts) pulls electrons (Θ) from the grounded substrate 54 into the charge storage layer 64 such that the charge storage layer 64 is evenly charged with electrons (Θ). This FN tunneling operation involves a relatively small amount of current and therefore consumes relatively low power.

FIG. 4 is a cross-sectional view of the structure of the conventional dual-bit memory cell during band-to-band hot hole (BTBHH) programming operation. The basic structure of the memory cell 50 is described above with respect to FIG. 1, and for sake of brevity will not be described again. This particular bias configuration, can be used to inject hot holes (electrically positively charged) into the right hand side (bit 2) of the nitride charge storage layer 64 to neutralize electrons stored at bit 2 thereby "programming" bit 2 of the memory cell 50. The right bit (bit 2) is programmed by applying a relatively high negative voltage to gate 68 via the appropriately selected word line, floating the bit line corresponding to first buried junction region 60 (which serves as the source in this case), and applying a medium positive bias voltage to the bit line corresponding to second buried junction region 61 (which serves as the drain in this case). This injects holes into the nitride layer 64 to neutralize electrons trapped in the nitride layer 64 at bit 2. Although not shown, by switching the drain/source biasing condition, holes can be injected into bit 1. The left bit (bit 1) is programmed by applying a relatively high negative voltage to gate 68 via the appropriately selected word line, floating the bit line corresponding to second buried junction region 61 (which serves as the source in this case), and applying a medium positive bias voltage to the bit line corresponding to first buried junction region 60 (which serves as the drain in this case).

FIG. 5 is a cross-sectional view of a conventional dual-bit memory cell 50 which illustrates residual electrons (Θ) that result in the center of the charge storage layer 64 as a result of the program operation. In an ideal situation, after programming one of the bits 1, 2 of the memory cell 50, the other one of the bits 2, 1 would contain exactly one-half of the electrons that were initially established in the charge storage layer 64 during the charge up operation of FIG. 3. In other words, in an ideal situation, when bit 1 is programmed, one-half of the electrons at bit 1 would be neutralized, when bit 2 is programmed, one-half of the electrons at bit 2 would be neutralized, and if both bit 1 and 2 are programmed the entire charge storage layer 64 would be neutralized. However, as illustrated in FIG. 5, band-to-band hot hole (BTBHH) programming leaves residual electrons (Θ) in the center portion of the charge storage layer 64 since hot holes can not be injected that far and therefore residual electrons (Θ) can not be neutralized. This results in degraded device operation or performance and reliability problems. For example, the residual electrons (Θ) in the center portion of the charge storage layer 64 can interfere with transistor operation since the transistor is no longer uniform because the threshold voltage at the center of the charge storage layer 64 would be different than the threshold voltages near the ends of the charge storage layer 64.

Notwithstanding these advances, it would be desirable to provide improved techniques for erasing and/or programming a dual-bit memory cell. Furthermore, other desirable features and characteristics of the present invention will become apparent from the subsequent detailed description of the invention and the appended claims, taken in conjunction with the accompanying drawings and this background of the invention.

SUMMARY

Techniques for programming and erasing a memory are provided.

According to one embodiment, techniques for erasing a memory can be provided in which electrons can be injected into at least one charge storage region to erase the memory. The charge storage regions can be physically and electrically separated by an isolation region disposed between the charge storage regions such that electrons are only injected into at least one of the charge storage regions. Electron injection can be accomplished, for example, by Fowler-Nordheim (FN) electron tunneling technique in which electrons are tunneled into at least one of the charge storage regions to erase the memory. Fowler-Nordheim (FN) electron tunneling can be accomplished, for example, by grounding a substrate and then applying a positive bias voltage to a gate to pull electrons from the substrate into at least one of the charge storage regions.

According to another embodiment, techniques for programming a memory can be provided in which holes can be injected into at least one of the charge storage regions, which initially holds electrons, to program the memory. The charge storage regions can be physically and electrically separated by an isolation region disposed between the charge storage regions such that holes are only injected into at least one of the charge storage regions. Injecting holes into the at least one of the charge storage regions neutralizes electrons held in the at least one of the charge storage regions. Hole injection can be accomplished, for example, using a band-to-band hot hole (BTBHH) programming technique which involves applying a positive bias voltage to a source or drain region of a substrate and applying a negative voltage to a gate to pull holes from either the source region or the drain region into at least one of the charge storage regions. After programming, the isolation region and at least one of the charge storage regions are substantially charge free such that substantially no residual electrons remain in the isolation region and the at least one of the charge storage regions.

BRIEF DESCRIPTION OF THE DRAWINGS

The present invention will hereinafter be described in conjunction with the following drawing figures, wherein like numerals denote like cells, and wherein.

DETAILED DESCRIPTION AN EXEMPLARY EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 6-9 describe an erasing operation and a programming operation in a dual-bit memory cell 150 in which two charge storage regions are physically and electrically separated from one another by an isolation region 170.

Figure 6:
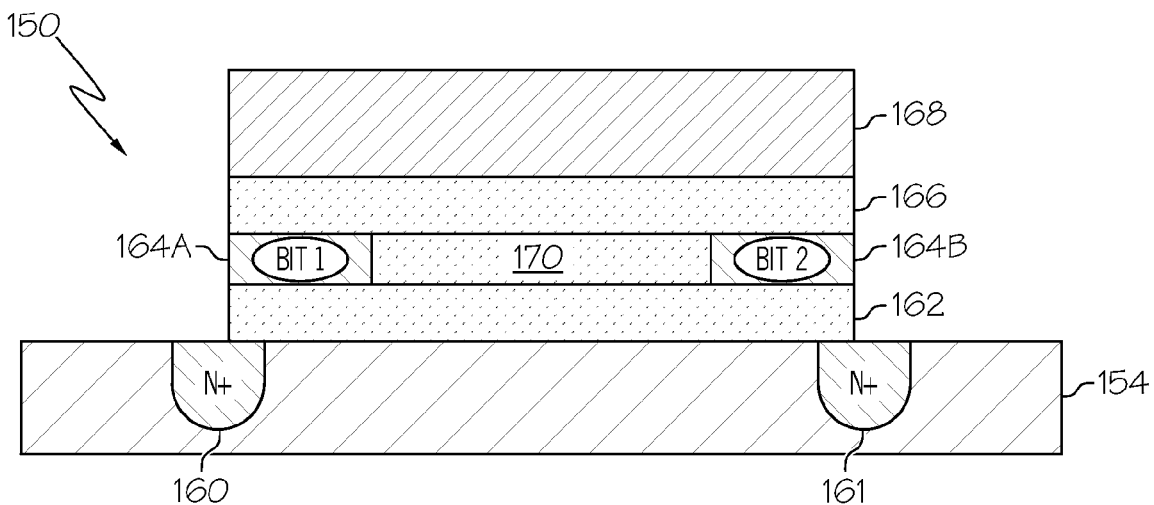
FIG. 6 is a cross-sectional view of a portion of a dual-bit memory cell.

FIG. 6 is a cross-sectional view of a portion of a dual-bit memory cell 150 in accordance with an exemplary embodiment of the present invention. The dual-bit memory cell 150 comprises a substrate 154 having a first buried junction (e.g., source) region 160 and a second buried junction (e.g., drain) region 161 formed within substrate 154 in self-alignment with the memory device 150, a first insulator layer 162 disposed over the substrate 154, a pair of charge storage layers 164A, 164B each being disposed over the first insulator layer 162, a second insulator layer 166 disposed over the charge storage regions 164A, 164B, an isolation region 170 disposed between the first insulator layer 162 and the second insulator layer 166 and also disposed between charge storage regions 164A, 164B, and a control gate 168 disposed over the second insulator layer 166. A first metal silicide contact (not shown) can be disposed on substrate 154, and the control gate 166 can be capped with a second metal silicide contact (not shown).

The charge storage regions 164A, 164B are physically and electrically separated by the isolation region 170 which is disposed between the charge storage regions 164A, 164B such that charge (e.g., electrons) can only be injected into the charge storage regions 164A, 164B. In one implementation, the control gate 168 may comprise polysilicon, the charge storage regions 164A, 164B may comprise nitride, such as silicon-rich nitride, aluminum oxide, polysilicon, low K dielectric or other equivalent charge trapping materials, and the isolation region 170 may comprise, for example, an oxide. Thus, depending on the implementation, the dielectric stack may comprise, for example, an oxide-nitride-oxide (ONO) stack, an oxide-silicon rich nitride-oxide (ORO) stack, an oxide-poly-oxide (OSO) stack, an oxide-nitride-oxide-nitride-oxide (ONONO) stack, an oxide-silicon rich nitride-oxide-silicon rich nitride-oxide (ORORO) stack, etc.

According to one embodiment, techniques for erasing the dual-bit memory cell 150 are provided in which electrons can be injected into at least one of the charge storage regions 164 A, B to erase the memory cell 150.

Figure 7:
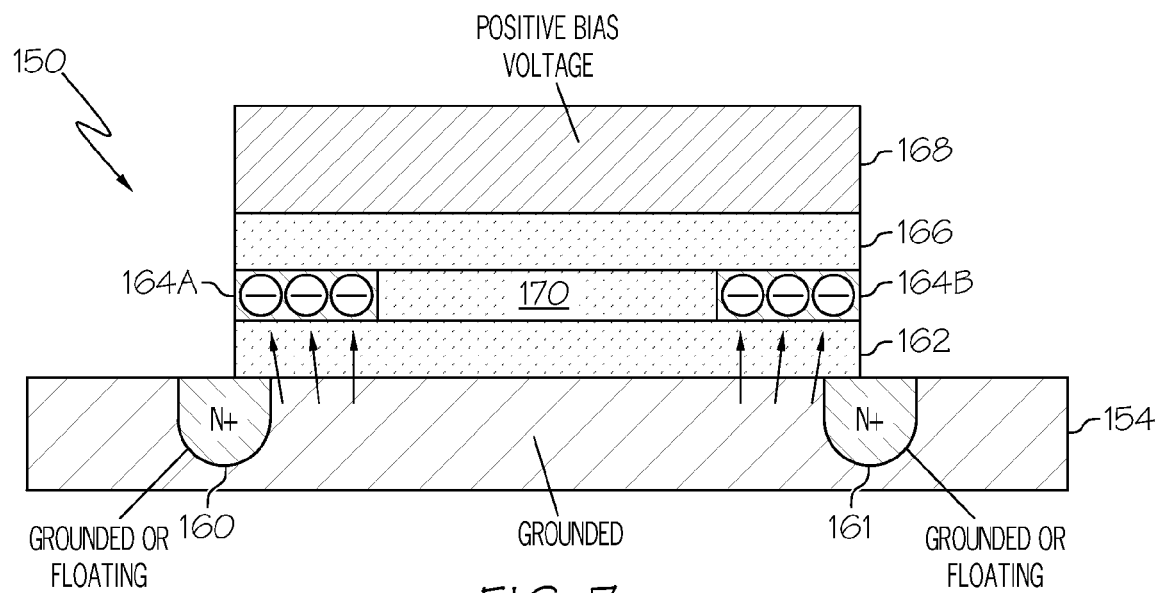
FIG. 7 is a cross-sectional view of the portion of the dual-bit memory cell which illustrates a Fowler-Nordheim (FN) erase operation in accordance with an exemplary embodiment of the present invention.

FIG. 7 is a cross-sectional view of a portion of a dual-bit memory cell 150 which illustrates a Fowler-Nordheim (FN) erase operation in accordance with an exemplary embodiment of the present invention. According to this Fowler-Nordheim (FN) erase operation, electrons (Θ) are only injected or tunneled into at least one of the charge storage regions 164A, 164B of the memory cell 150. Fowler-Nordheim (FN) electron tunneling can be accomplished, for example, by floating or grounding the buried junction regions 60, 61, grounding the substrate 154 and then applying a relatively high positive bias voltage to the control gate 168 to pull electrons from the substrate 154 into at least one or both of the charge storage regions 164A, 164B. The charge storage regions 164A, 164B can be physically and electrically separated by the isolation region 170 disposed between the charge storage regions 164A, 164B such that electrons are only injected into the charge storage regions 164A, 164B and not into the isolation region 170. The FN tunneling operation involves a relatively small amount of current and therefore consumes relatively low power.

Figure 8:
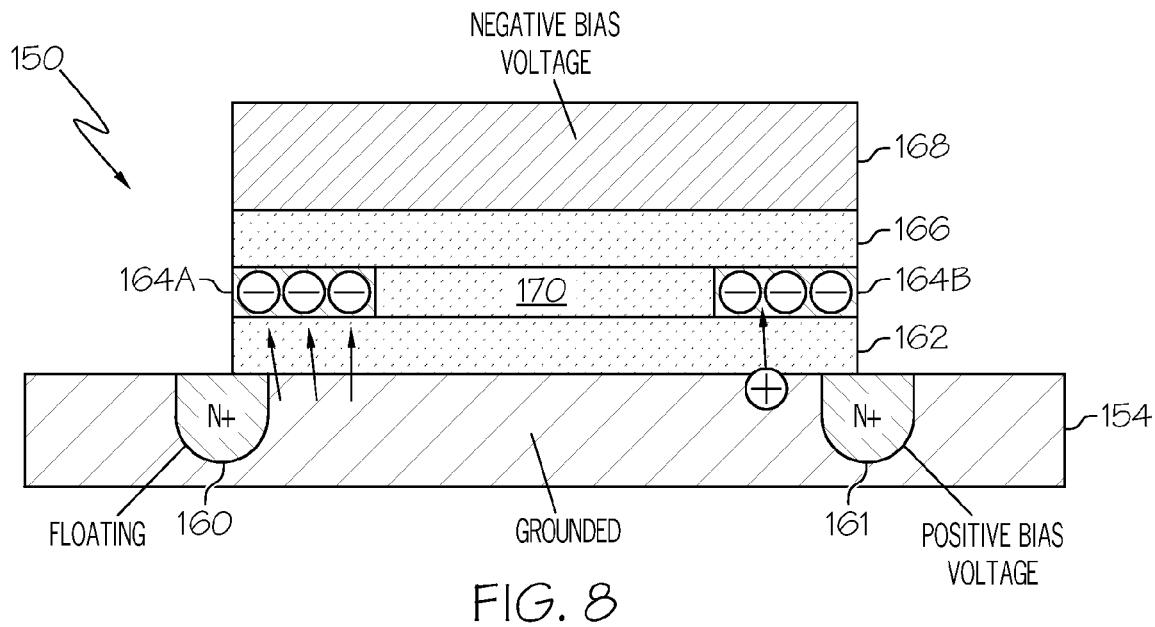
FIG. 8 is a cross-sectional view of the portion of the dual-bit memory cell which illustrates a band-to-band hot hole (BTBHH) program operation in accordance with an exemplary embodiment of the present invention.

FIG. 8 is a cross-sectional view of a portion of a dual-bit Memory cell 150 which illustrates a band-to-band hot hole (BTBHH) "program" operation in accordance with an exemplary embodiment of the present invention. The charge storage regions 164A, 164B can each initially hold electrons. During the band-to-band hot hole (BTBHH) program operation, holes can be injected into at least one of the two charge storage regions 164A, 164B of the memory cell 150 to neutralize the electrons (Θ) stored in the at least one of the charge storage regions 164A, 164B as bit 1 and/or bit 2. This can be accomplished, for example, by floating the first buried junction (e.g., source) region 160, applying a positive bias voltage (e.g., 5 volts) to the second buried junction (e.g., drain) region 161, and applying a negative voltage (e.g., −6 volts) to the control gate 168 to pull holes from region 161 into one of the charge storage regions 164A, 164B. The charge storage regions 164A, 164B are physically and electrically separated by the isolation region 170 disposed between the charge storage regions 164A, 164B. As such, holes can only be injected into the charge storage regions 164A, 164B.

Figure 1:
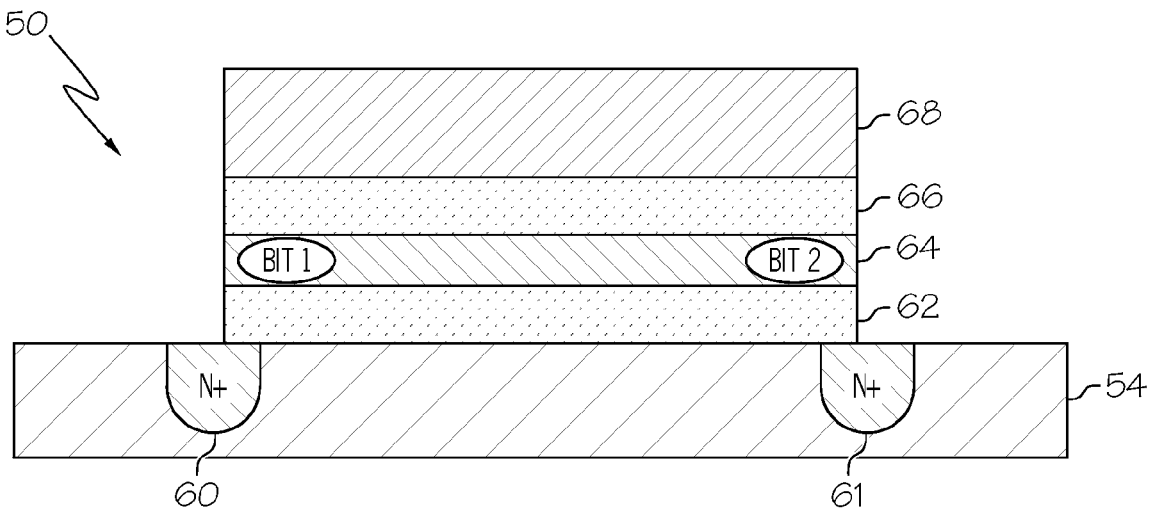
FIG. 1 is a simplified cross-sectional view of a conventional dual-bit memory cell.
Figure 3:
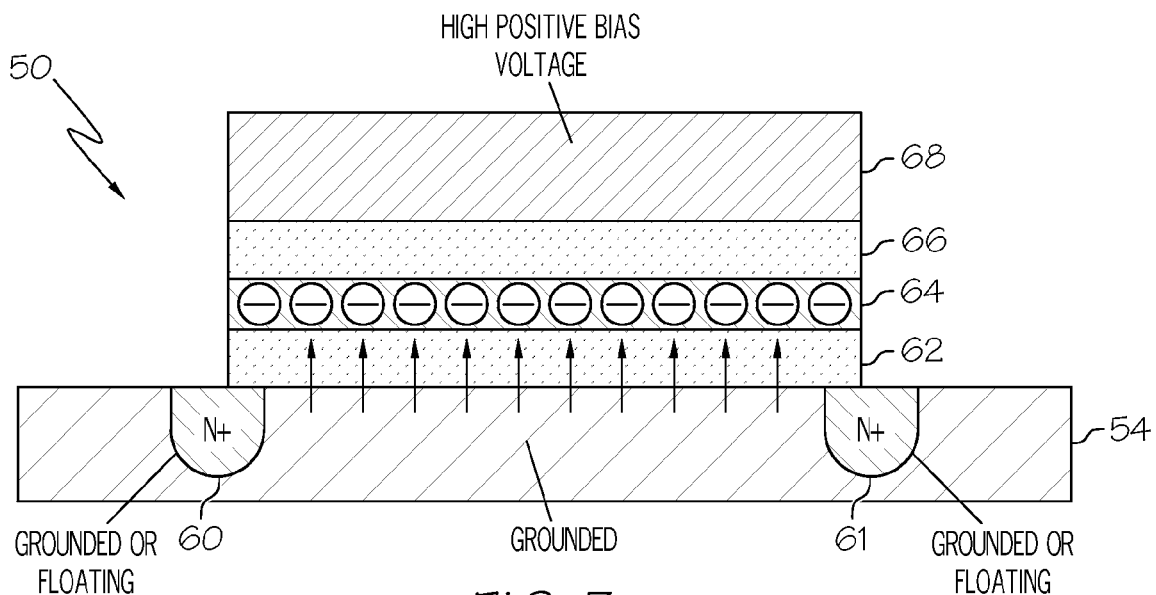
FIG. 3 is a cross-sectional view of the conventional dual-bit memory cell during a Fowler-Nordheim (FN) erase operation.
Figure 2:
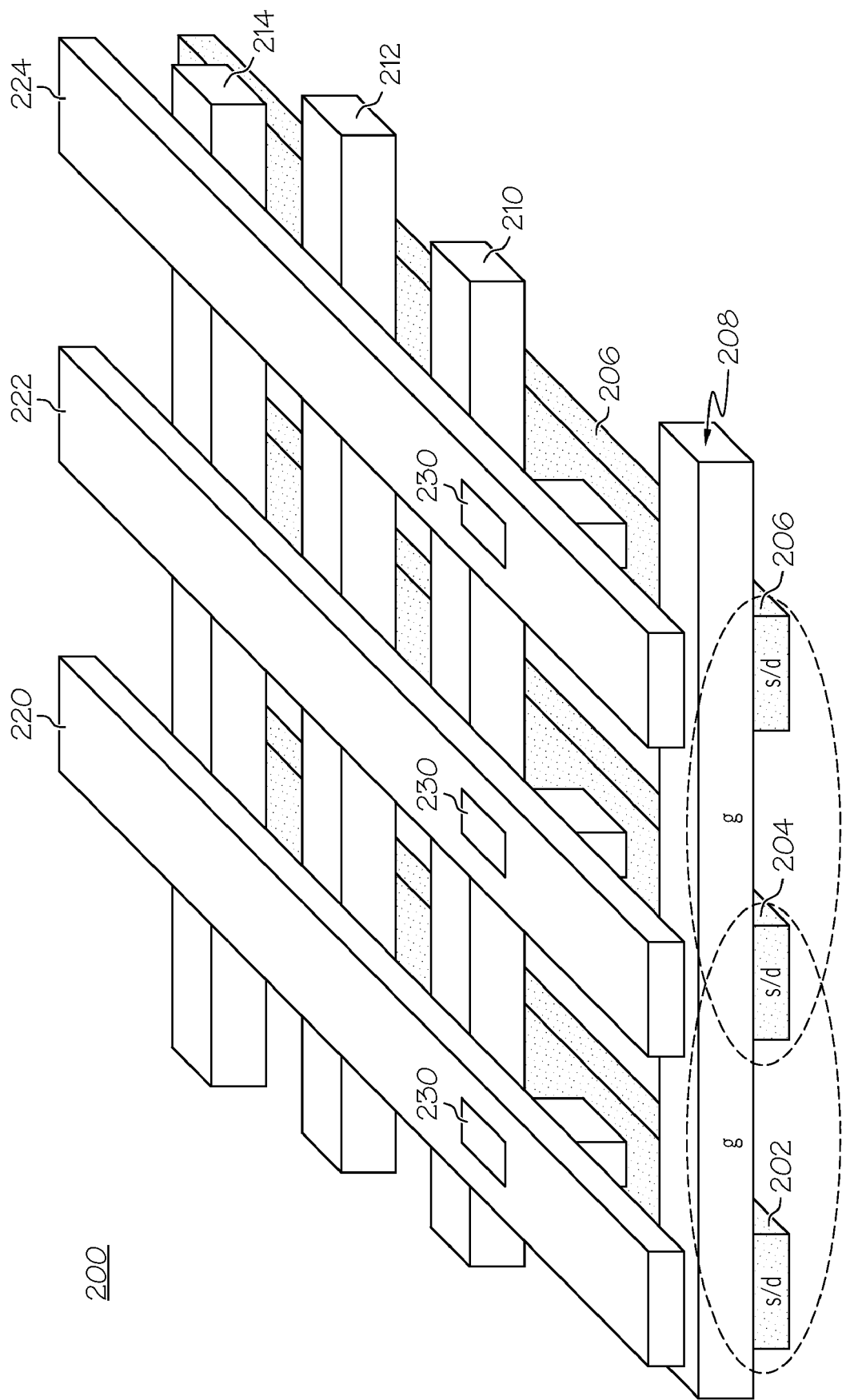
FIG. 2 is a simplified diagram of a plurality of dual-bit memory cells arranged in accordance with a conventional array architecture.
Figure 4:
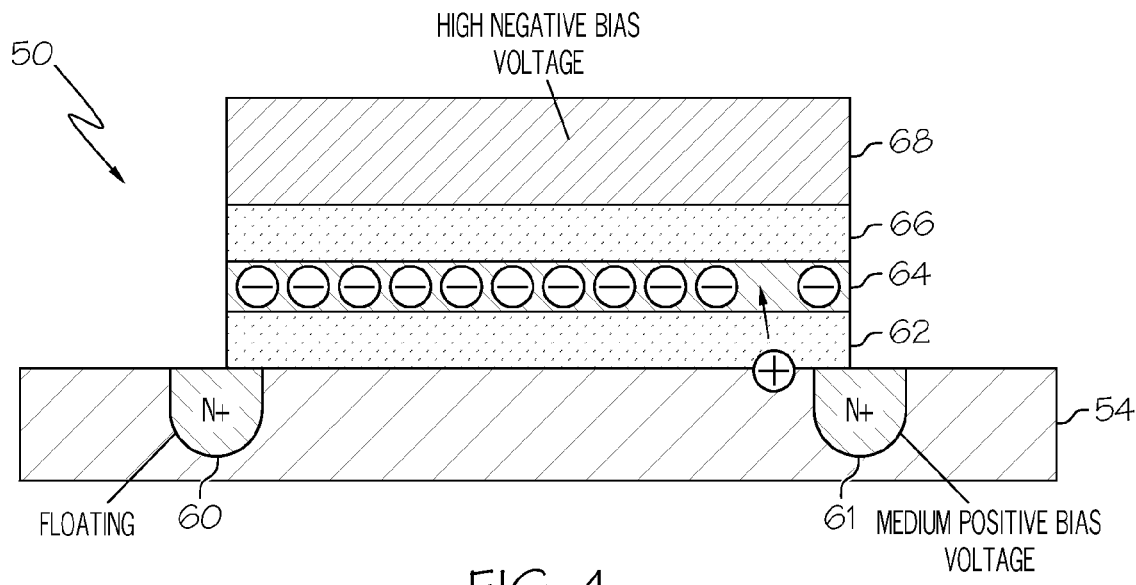
FIG. 4 is a cross-sectional view of the structure of the conventional dual-bit Memory cell during band-to-band hot hole (BTBHH) programming operation.
Figure 5:
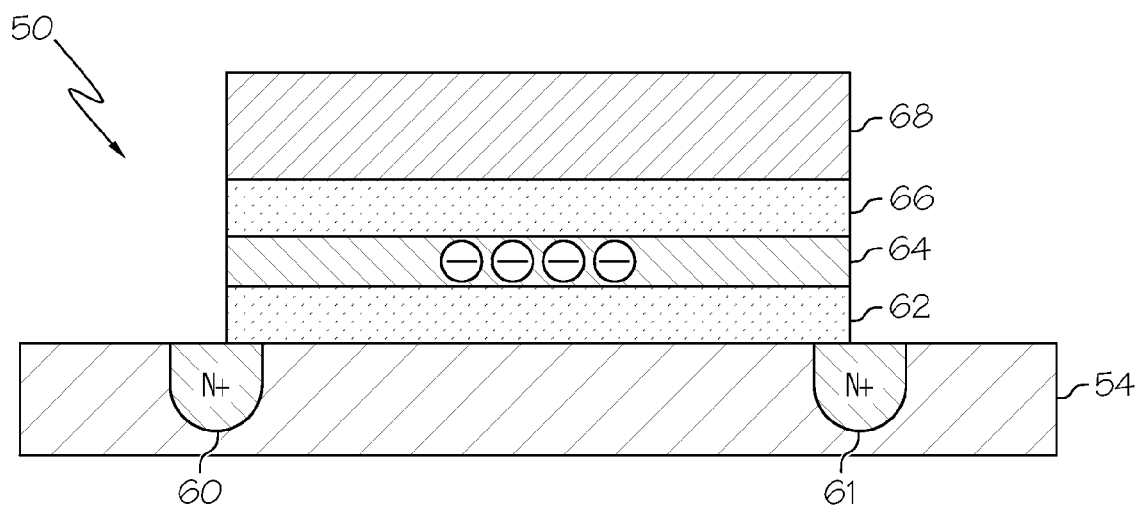
FIG. 5 is a cross-sectional view of a conventional dual-bit memory cell which illustrates residual electrons (Θ) that remain in the center of the charge storage layer after the band-to-band hot hole (BTBHH) programming operation.
Figure 9:
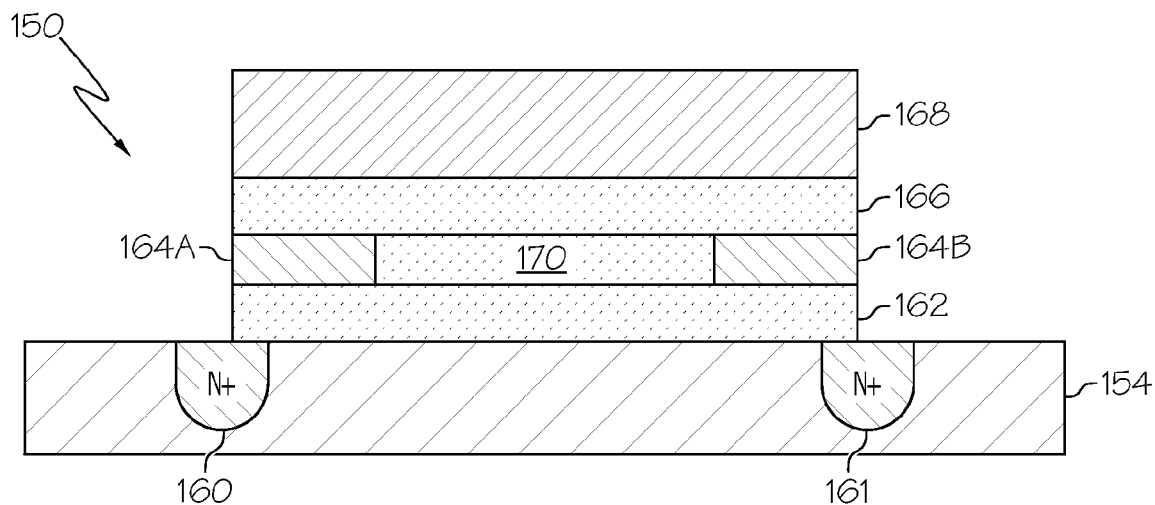
FIG. 9 is a cross-sectional view of the portion of the dual-bit memory cell which illustrates an electron free charge storage layer that results after BTBHH program operation in accordance with an exemplary embodiment of the present invention.

FIG. 9 is a cross-sectional view of a portion of a dual-bit memory cell 150 which illustrates an electron free isolation region 170 and electron free charge storage regions 164A, 164B in accordance with an exemplary embodiment of the present invention. Following the BTBHH programming operation, in contrast to FIG. 5, the isolation region 170 and at least one of the charge storage regions 164A, 164B are substantially charge free (e.g., no residual electrons (Θ) remain trapped in the isolation region 170 and at least one of the charge storage regions 164A, 164B) after the CCH "program" operation. Thus, in contrast to FIG. 5, device operation or performance can be improved and a more uniform and reliable transistor structure is provided. The threshold voltage in isolation region 170 is substantially the same as the threshold voltages in the charge storage layer regions 164 A, B.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of cells described in an exemplary embodiment without departing from the scope of the invention as set forth in the appended claims and their legal equivalents.

What is claimed is:
1. A method, comprising:
providing a memory comprising a first charge storage region spaced apart from a second charge storage region by an isolation region, a gate and a substrate comprising a buried junction region; and programming the memory by injecting holes into the at least one of the charge storage regions to neutralize electrons in the at least one of the charge storage regions by applying a negative voltage to the gate and a positive voltage to the buried junction region.

2. A method according to claim 1, further comprising:

injecting electrons into at least one of the charge storage regions via Fowler-Nordheim (FN) tunneling to erase the at least one charge storage region.

3. A method according to claim 2, wherein Fowler-Nordheim (FN) tunneling comprises:

grounding the substrate;

applying a positive voltage to the gate to pull electrons from the substrate to the at least one of the charge storage regions.

4. A method according to claim 1, wherein the charge storage regions are physically and electrically separated by the isolation region disposed between the charge storage regions.

5. A method according to claim 1, wherein the isolation region and at least one of the charge storage regions are substantially charge free after programming.

6. A method according to claim 5, wherein the isolation region and at least one of the charge storage regions are substantially charge free after programming such that substantially no residual electrons remain in the isolation region following programming.

7. A method according to claim 2, electrons are only injected into the at least one of the charge storage regions.

8. A semiconductor device, comprising:

a substrate comprising a buried junction region;

a gate;

an isolation region;

a first charge storage region;

a second charge storage region spaced apart from the first charge storage region by the isolation region, wherein at least one of the charge storage regions is configured to be programmed by injecting holes into the at least one of the charge storage regions to neutralize electrons in the at least one of the charge storage regions by applying a negative voltage to the gate and a positive voltage to the buried junction region.

9. A semiconductor device according to claim 8, wherein the charge storage regions are physically and electrically separated by the isolation region disposed between the charge storage regions.

10. A semiconductor device according to claim 8, wherein holes are only injected into the charge storage regions.

11. In a memory comprising a first charge storage region spaced apart from a second charge storage region by an isolation region, a substrate having a buried junction region, and a gate, wherein at least one of the charge storage regions hold electrons, a method comprising:

injecting holes into at least one of the charge storage regions by: applying a positive voltage to the buried junction region; and applying a negative voltage to the gate to program at least one of the charge storage regions by injecting holes from the buried junction region into the at least one of the charge storage regions to neutralize electrons in the at least one of the charge regions.

12. A method according to claim 11, further comprising:

injecting electrons into at least one of the charge storage regions to erase the at least one charge storage region.

13. A method according to claim 12, wherein injecting electrons into at least one of the charge storage regions to erase the at least one charge storage region of the memory, comprises Fowler-Nordheim (FN) tunneling electrons into at least one of the charge storage regions to erase the at least one of the charge storage regions.

14. A method according to claim 13, wherein the memory further comprises a substrate and a gate, and wherein Fowler-Nordheim (FN) tunneling comprises:

grounding the substrate; and applying a positive voltage to the gate to pull electrons from the substrate into the at least one of the charge storage regions to erase the at least one charge storage region.

15. A method according to claim 12, wherein the charge storage regions are physically and electrically separated by the isolation region disposed between the charge storage regions.

16. A method according to claim 12, electrons are only injected into the at least one of the charge storage regions.

17. A method according to claim 11, wherein the charge storage regions are physically and electrically separated by the isolation region disposed between the charge storage regions.

18. A method according to claim 17, wherein the isolation region and charge storage regions are substantially charge free after programming such that substantially no residual holes remain in the isolation region following programming.

19. A method according to claim 18, holes are only injected into the charge storage regions.

* * * * *